United States Patent [19]

McGinniss et al.

[11] Patent Number: 4,571,377
[45] Date of Patent: Feb. 18, 1986

[54] PHOTOPOLYMERIZABLE COMPOSITION CONTAINING A PHOTOSENSITIVE DONOR AND PHOTOINITIATING ACCEPTOR

[75] Inventors: Vincent D. McGinniss, Delaware; Robert E. Schwerzel, Powell, both of Ohio

[73] Assignee: Battelle Memorial Institute, Columbus, Ohio

[21] Appl. No.: 572,938

[22] Filed: Jan. 23, 1984

[51] Int. Cl.[4] .............................................. G03C 1/68
[52] U.S. Cl. ...................................... 430/81; 430/286; 430/912; 430/915; 430/929; 430/921; 430/925; 522/4; 522/8
[58] Field of Search ............... 430/281, 328, 915, 286, 430/912, 925, 921, 920; 204/159.14, 159.18, 159.22, 159.23

[56] References Cited

U.S. PATENT DOCUMENTS

| | | | |
|---|---|---|---|
| 3,041,476 | 8/1977 | Swainson | 430/173 |
| 3,399,993 | 9/1968 | Agnew | 96/27 |
| 3,544,402 | 12/1970 | Agnew | 156/58 |
| 3,607,691 | 9/1971 | Goldberg et al. | 430/281 |
| 3,607,706 | 9/1971 | Adamson | 340/173 |
| 3,615,567 | 10/1971 | Wilson | 430/915 |
| 3,627,656 | 12/1971 | Miller et al. | 430/281 |
| 3,661,588 | 5/1972 | Chang | 430/915 |
| 3,697,280 | 10/1972 | Stilko | 430/915 |
| 3,756,827 | 9/1973 | Chang | 430/915 |
| 3,829,838 | 8/1974 | Lewis et al. | 340/173 |
| 3,876,519 | 4/1975 | McGinniss | 204/159.24 |
| 4,001,017 | 1/1977 | Baumann et al. | 430/281 |
| 4,050,942 | 9/1977 | Nacci | 430/328 |
| 4,078,229 | 3/1978 | Swanson et al. | 340/173 |
| 4,269,933 | 5/1981 | Pazos | 430/281 |
| 4,271,251 | 6/1981 | Aotani et al. | 430/281 |
| 4,343,885 | 8/1982 | Reardon | 430/281 |

FOREIGN PATENT DOCUMENTS 1243043 8/1971 United Kingdom .

OTHER PUBLICATIONS

Lewis et al., IEEE Transaction on Electron Devices, Aug. 1971.

Primary Examiner—Jack P. Brammer
Attorney, Agent, or Firm—Mueller and Smith

[57] ABSTRACT

Disclosed is a photopolymerizable vehicle and method for the selective photopolymerization of said vehicle by the application of a plurality of different selected wavelengths of energy wherein any single wavelength of energy is inadequate for effecting said photopolymerization. The method comprises sequentially applying a plurality of different selected wavelengths of energy to said vehicle whereby polymerization is effected at the intersection of said wavelengths of energy. The photopolymerizable vehicle comprises:

(a) a medium selected from photopolymerizable ethylenically unsaturated monomers, oligomers, prepolymers, or mixtures thereof;

(b) a photosensitive donor responsive to first selective wavelengths of energy for generating primary excited-state donor molecules which are not responsive to said first selected wavelengths of energy, but are responsive to sequentially applied second selective wavelengths of energy for generating secondary higher energy level excited-state donor molecules; and (c) a photoinitiating acceptor having a ground energy state below said primary donor energy state and a lowest primary excited state at least about 5 kcal/mole greater than said primary excited state of said donor, said secondary higher energy level excited state donor molecules being at least about 5 kcal/mole greater than said lowest primary excited state of said acceptor and transferring energy to said acceptor for initiating photopolymerization of said vehicle.

Wavelengths of energy for effecting the selective photopolymerization preferably are generated by lasers.

6 Claims, 3 Drawing Figures

PHOTOPOLYMERIZABLE COMPOSITION CONTAINING A PHOTOSENSITIVE DONOR AND PHOTOINITIATING ACCEPTOR

BACKGROUND OF THE INVENTION

The present invention relates to photochemical machining and more particularly to an improved photoinitiator system therefor. The government has rights in this invention pursuant to DARPA Contract No. F49620-82-C-0077 awarded by U.S. Air Force, Office of Scientific Research, Advanced Research Projects Agency.

While the production of castings having complex, three-dimensional shapes is necessary in today's technologically-oriented marketplace, skilled artisans must labor for substantial amounts of time to transform a set of blueprints and specifications into a three-dimensional form, e.g. for the creation of dies used to fabricate stamped or molded objects. While the introduction of computer assisted design and manufacturing (CAD/CAM) techniques have increased the speed and flexibility of these processes, the skilled artisan's hands yet are necessary due to intrinsic limitations of conventional manufacturing techniques. That is, conventional manufacturing techniques require not only the use of a multiplicity of tools-lathes for the generation of cylindrical ribbed or round forms, drills for holes, milling machines for flat surfaces, and the like-but also the application of force for the removal of material being machined. Such force application must be tempered with the precision required in such machining operations, however.

Technology which has emerged as a proposed solution to the foregoing problems may be referred to as photochemical machining or PCM. PCM is the computer-assisted fabrication of a plastic pattern directly from design specifications by the selective, three-dimensional modification of a plastic material which is exposed simultaneously to two or more sources of energy, e.g. laser beams, focused onto a single point within the volume of the plastic material. If the chemical composition of the plastic is designed properly, the solubility and hardness of the plastic can be altered selectively at the point of intersection of the selected wavelengths of energy without being affected by either wavelength alone. Given the appropriate computerized description, entire complex clusters, made of disposable pattern material and ready for casting, could be automatically generated, tested, and remade by simple changes in the computer program for the correction of gates and sprue routing, proportion, size, quantity, and the like.

Heretofore, photochemical machining has been proposed in British Pat. No. 1,243,043 and U.S. Pat. Nos. 3,609,706; 3,829,838; 4,078,229; and 4,041,476. While such technology has proven interesting, practical implementation in the marketplace has not occurred. This is believed to be due, in part, to the difficulty which the art has experienced in designing photopolymerizable vehicles which maintain the requisite clarity, definition, and control under the application of each wavelength of energy separately. That is, photopolymerizable vehicles proposed in the art operate with a substantial risk that a cloudy system will result and that less penetration of the second or subsequent wavelength of energy will penetrate sufficiently to provide a controlled reaction at the desired intersection of the plurality of applied wavelengths of energy. The present invention provides a practical solution to this problem by the design of a system which substantially precludes the risk of any polymerization occurring under application of the initial wavelength of energy, or for that matter, of any singly-applied wavelength of energy to the photopolymerizable vehicle.

BROAD STATEMENT OF THE INVENTION

The present invention is a method for the selective photopolymerization of a photopolymerizable vehicle by the application of a plurality of different selected wavelengths of energy wherein any single wavelength of energy is inadequate for effecting the photopolymerization. Such method comprises sequentially applying said plurality of different selected wavelengths of energy to said vehicle. The vehicle comprises a medium selected from photopolymerizable ethylenically unsaturated monomers, oligomers, prepolymers, or mixtures thereof; a photosensitive donor responsive to first selective wavelengths of energy for generating primary excited-state donor molecules which are not responsive to said first selected wavelengths of energy, but are responsive to sequentially applied second selective wavelengths of energy for generating secondary higher energy level excited-state donor molecules; and a photoinitiating acceptor having a ground energy state below said primary donor energy state and a lowest primary excited state at least about five kcal/mole above said primary excited state of said donor, said secondary higher energy level excited state donor molecules being at least about 5 kcal/mole higher than the lowest primary excited state of said acceptor and transferring energy to said acceptor for initiating photopolymerization of said vehicle.

Another aspect of the present invention is a photopolymerizable vehicle which can be selectively photopolymerized by the application of a plurality of different selected wavelengths of energy wherein any single wavelength of energy is inadequate for effecting said photopolymerization. The photopolymerizable vehicle comprises a medium selected from photopolymerizable ethylenically unsaturated monomers, oligomers, prepolymers, or mixtures thereof; a photosensitive donor responsive to first selective wavelengths of energy for generating primary excited-state donor molecules which are not responsive to said first selected wavelengths of energy, but are responsive to sequentially applied second selective wavelengths of energy for generating secondary higher energy level excited-state donor molecules; and a photoinitiating acceptor having a ground energy state below said primary donor energy state and a lowest primary excited state at least about 5 kcal/mole above said primary excited state of said donor, said secondary higher energy level excited state donor molecules being at least about 5 kcal/mole higher than the lowest primary excited state of said acceptor and transferring energy to said acceptor for initiating photopolymerization of said vehicle. It will be appreciated that the number of acceptor/donor combinations, and the number of different selected wavelengths of energy, may be more than two, as will be more fully detailed below.

Advantages of the present invention include the ability of the photopolymerizable vehicle to maintain requisite clarity and resolution under application of any single wavelengths of energy. Such clarity and resolution permit unique and precise control over the photopolymerization reaction which is another advantage of the present invention. These and other advantages will be readily apparent to those skilled in the art.

The drawings will be described in detail in connection with the description of the invention which follows.

DETAILED DESCRIPTION OF THE INVENTION

An important feature of the photoabsorbers used in the present invention is their lack of photoinitiating groups. A donor or combination of donors are sequentially activated to excited states but such excited states do not generate free radicals. Rather, upon application of the second selected wavelenghts of energy, the donor molecules are transformed to a sufficiently high energy state so that transfer of energy to the acceptor molecule can occur. The acceptor molecules bear the photoinitiating reactivity which via conventional free-radical intermediate generation results in the photopolymerization of the photopolymerizable vehicle. Without the presence of the second selective wavelength of energy, the excited state or states of the donor molecules will not result in any generation of photo-initiating functionality. Thus, the clarity and resolution of the vehicle is preserved which resolution permits precise control over the photopolymerization process for ensuring the generation of a three-dimensional figure within the vehicle which is of precise dimensions and surface configuration. Of course, it will be appreciated that a series of donor molecules may be excited one after the other prior to ultimate generation of an acceptor in an excited state. Thus, the use of three or more wavelengths of energy is comprehended within the broad teachings of the present invention.

Figure 1:
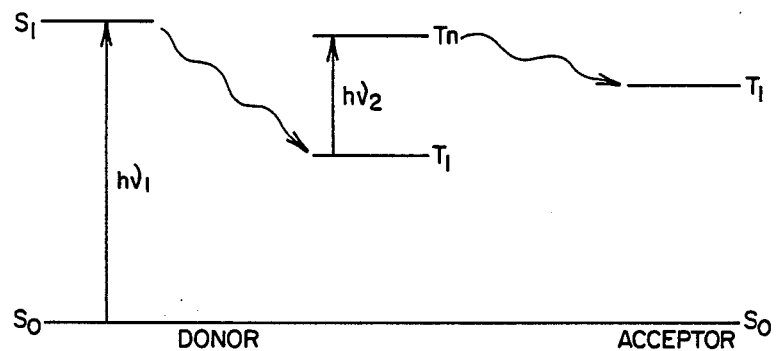
FIG. 1 is a schematic energy level diagram for a donor and acceptor pair subjected to photopolymerization in accordance with the present invention.

A variety of relationships between the excited states of the donor and acceptor molecules must be maintained in order for the present invention to operate effectively and efficiently as described herein. In order to explore these relationships more fully, reference is made to FIG. 1 which sets forth the energy transformation relationships between the donor and acceptor molecules. The donor molecule initially is excited by the application of energy ($h\nu_1$) to a high $S_1$ state which can then intersystem cross to a lower $T_1$ state. This process may or may not occur through radiationless transition from the $S_1$ state to an intermediate $T_2$ state of the donor. For simplicity of the drawings, the net result of the intersystem cross and radiationless transition to the relatively stable lower $T_1$ state has been shown on the drawings only. This simplification is for ease of understanding and is not to be construed as a misrepresentation or limitation on the invention. Assuming that no further energy is impacted on the photopolymerizable vehicle containing the donor molecule, the donor molecule in its excited triplet state would again revert to its $S_0$ state in conventional fashion. The donor molecule in its primary excited state, $T_1$, is not sensitive to $h\nu_1$ nor is the acceptor molecule. The vehicle, thus, maintains its clarity and resolution so that the risk of a single-beam photopolymerization is virtually suppressed.

Following the absorption of the primary selected wavelengths of energy, $h\nu_1$, by the donor, a second wavelength of energy, $h\nu_2$, is applied to the vehicle. The donor molecules in their primary excited state are responsive to this second input of energy which results in the donor molecules being excited to a higher triplet excited state, $T_n$ (which may be $T_2$ or a higher triplet excited state). Importantly, $T_1$ for the primary excited state donor molecules is at least about 5 kcal/mole less than the energy level of the lowest energy state, $T_1$, of the acceptor molecules. This energy relationship precludes any premature generation of an acceptor molecule in an excited state which would result in the generation of a free radical. Next, $T_n$ of the secondary higher energy level excited-state donor molecules is at least about 5 kcal/mole greater than $T_1$ of the acceptor molecules. This means that the donor molecule in its secondary higher energy level excited state will be in a position to transfer energy to the acceptor molecule, resulting in the generation of the acceptor molecule in an excited state. The thus-excited acceptor molecules then have an energy level which is sufficiently high to result in the fragmentation of the acceptor molecule with resultant release of free-radical intermediates for initiating photopolymerization of the photopolymerizable vehicle. This reaction sequence is set forth below in equation I:

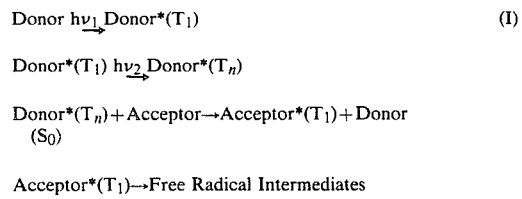

Acceptor*($T_1$)→Free Radical Intermediates

Suitable donor molecules which possess the requisite characteristics for utilization within the present invention include, for example, 9, 10-dibromoanthracene, meso-tetraphenylporphyrin, protoporphyrin IX dimethyl ester (Tsvirho et al., *Opt. Spectrosc.*, 34, 635 (1973) and Sapunov et al., *Zh. Prikl. Spektrosk*, 21, 667 (1974), and similar molecules. Such representative donor molecules contain chromophore groups (i.e. light absorbing moeities) which respond to given wavelengths of energy. Such donor molecules, however, do not possess functionality capable of generating free radical intermediates. Thus, excitation of such donor molecules does not risk cloudying the system with resultant diminishment of penetration of subsequent wavelengths of energy.

Suitable acceptor molecules which may be utilized in the present invention desirably will have a low extinction coefficient at the given wavelengths and include, for example, napthalene sulfonyl chloride, quinolene sulfonyl chloride, α-chloromethyl-napthalene, and the like. Such acceptors bear chromophore functionality (which typically absorbs, however, at wavelengths different from the donor molecules) as well as free radical-generating functionality. It should be realized that the donor molecules may be suitably modified to add a free radical-generating group for formation of additional acceptor molecules, e.g. brominated porphyrin, brominated rubrene, and the like. The molar ratio of acceptor molecules to donor molecules desirably is about 3:1 or greater to ensure the generation of acceptor excited molecules at the appropriate time. The characteristics which the foregoing representative donor and acceptor molecules possess is set forth in Table I below.

TABLE I

| | $S_1$ (kcal/mole) | $T_1$ (kcal/mole) | $T_2$ (kcal/mole) | $h\nu_1$ (nm) | $h\nu_2$ (nm) |
|---|---|---|---|---|---|
| Donor | | | | | |
| 9,10-Dibromo anthracene | 76 | 40 | 72 | 376 | 540 |
| Protoporphyrin IX Dimethyl ester | 45 | 35 | 75 | 630 | 730 |
| Benzil | 59 | 53 | 59 | 400 | 486 |
| Acceptor | | | | | |
| Napthalene Sulfonyl Chloride | ~90 | ~60 | — | — | — |
| α-Chloromethyl Napthalene | ~90 | ~60 | — | — | — |
| Quinolene Sulfonyl Chloride | ~90 | ~60 | — | — | — |

Figure 2:
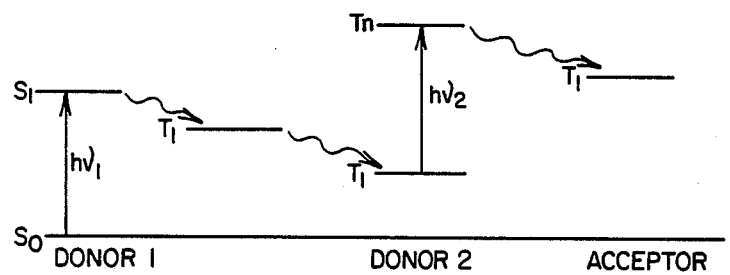
FIG. 2 is a schematic energy level diagram for a system employing two donors and an acceptor.
Figure 3:
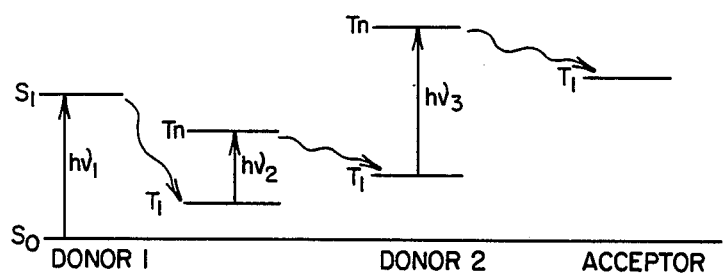
FIG. 3 is an alternative two donor embodiment of the schematic energy level diagram of FIG. 2.

Referring to FIG. 2, it will be appreciated that advantage of prior art photoresponsive molecules may be employed in combination with the donor/acceptor molecules disclosed herein. For example, benzil (see Table I above) may be excited by application of the desired wavelength of energy (486 nm) to an $S_1$ singlet state. The intersystem transfer by radiationless energy to a lowest triplet state, $T_1$, of benzil makes the excited state benzil molecule suitable for transfer of its energy to a donor molecule which has a $T_1$ triplet state less than the $T_1$ energy level of benzil and generally at least about 5 kcal/mole less. Note that the examplary donor molecules set forth in Table I each could receive the energy from the $T_1$ state of benzil for generation of a primary excited state donor molecule. Such primary excited state donor molecules then could be activated by a second selected wavelength of energy for forming the higher energy $T_n$ donor molecules which then could transfer energy to the acceptor molecule, as described in connection with the description of FIG. 1. A variation of this scheme is set forth in FIG. 3. The $T_1$ state of donor 1 molecules in FIG. 3 is less than $T_1$ state of donor 2 molecules. Thus, application of the second wavelength of energy would result in the generation of the $T_1$ primary excited state donor 2 molecules. A third selected wavelength of energy then would be necessary for eventual generation of excited state acceptor molecules. It will be appreciated that the number of molecules which may be used as donor or pre-donor molecules may be multiple in numbers, though practical implementation of these schemes may prove less useful. These reaction schemes are set forth in equations II and III below.

$$\text{Donor 1} \xrightarrow{h\nu_1} \text{Donor 1*}(T_1) \quad \text{(II)}$$

$$\text{Donor 1*}(T_1) + \text{Donor 2} \longrightarrow \text{Donor 2*}(T_1) + \text{Donor 1}(S_0)$$

$$\text{Donor 2*}(T_1) \xrightarrow{h\nu_2} \text{Donor 2*}(T_n)$$

$$\text{Donor 2*}(T_n) + \text{Acceptor} \longrightarrow \text{Acceptor *}(T_1) + \text{Donor 2}(S_0)$$

$$\text{Acceptor **}(T_1) \longrightarrow \text{Free Radical Intermediates}$$

$$\text{Donor 1} \xrightarrow{h\nu_1} \text{Donor 1*}(T_1) \quad \text{(III)}$$

$$\text{Donor 1*}(T_1) \xrightarrow{h\nu_2} \text{Donor 1*}(T_n)$$

$$\text{Donor 1*}(T_n) + \text{Donor 2} \longrightarrow \text{Donor 2*}(T_1) + \text{Donor 1}(S_0)$$

$$\text{Donor 2*}(T_1) \xrightarrow{h\nu_3} \text{Donor 2*}(T_n)$$

$$\text{Donor 2*}(T_n) + \text{Acceptor} \longrightarrow \text{Acceptor *}(T_1) + \text{Donor 2}(S_0)$$

$$\text{Acceptor *}(T_1) \longrightarrow \text{Free Radical Intermediates}$$

Use of lasers is recommended for practice of the present invention as lasers may be tuned to selected wavelengths of energy by use of the lasing medium, specially-fitted filters, or like techniques well known in the art. The monochromatic generation of selected wavelengths of energy make lasers ideally suited for use in the present invention. Additionally, laser beams may be focused on precise and small areas within the volume of photopolymerizable vehicle for generation of desired shapes of cured vehicle therein. Additionally, laser beams may be suitably controlled by computers as is known in the art. Reference to the citations in the Background of the Invention is made for more details of lasers and their control for use in photochemical machining.

Photopolymerizable vehicles for use in the present invention generally will be monomers, oligomers, prepolymers, or mixtures thereof of ethylenically-unsaturated materials. Representative vehicles include reactive vinyl monomers such as the lower alkyl esters of acrylic and methacyrlic acids or polymers or prepolymers thereof. Vinyl monomers particularly adapted for photopolymerization include, for example, methyl methacrylate, ethyl methacrylate, 2-ethylhexyl methacrylate, butyl acrylate, isobutyl methacrylate; the corresponding hydroxy acrylates, e.g. hydroxy ethyl acrylate, hydroxy propyl acrylate, hydroxy ethyl hexyl acrylate; also the glycol acrylates, e.g. ethylene glycol dimethacrylate, hexamethylene glycol dimethacrylate;- the allyl acrylates, e.g. allyl methacrylate;diallyl methacrylate;the epoxy acrylates, e.g. glycidyl methacrylate; and the aminoplast acrylates, e.g. melamine acrylate. Other vehicle compounds include vinyl acetate, vinyl and vinylidene halides and amides, e.g., methacrylamide, acrylamide, diacetone acrylamide, butadiene, styrene, vinyl toluene and the like. A variety of other compounds may be used as is well known in the art. It should be mentioned at this juncture in the application, that the activation of dyes for generation of three-dimensional images may also be conducted in accordance with the precepts of the present invention and as described in the Background art, though the utilization of photopolymerizable vehicles is believed to be the best use of the invention.

The photopolymerizable medium, donor molecules and acceptor molecules comprise the photopolymerizable vehicle of the present invention. Since clarity of the vehicle is desired for suppressing undesirable screening of wavelengths of energy transmitted therethrough, traditional fillers, colorants, and the like should be avoided. It should be recognized, however, that colloidal silica or like particles, preferably transparent and of suitable concentration may find utility in reinforcing the polymerized vehicle providing that the requisite transparency and transmissivity of the vehicle is maintained.

The following examples show how the present invention can be practiced but should not be construed as limiting. In this application, all percentages and proportions are by weight and all units are in the metric system, unless otherwise expressly indicated. Also, all citations are expressly incorporated herein by reference.

EXAMPLES

EXAMPLE 1

The chemicals used included 9,10-dibromoanthracene (DBA), 2-napthalene sulfonyl chloride (NSC), and 99 percent methyl methacrylate (MMA). The naphtalene sulfonyl chloride was recrystallized from chloroform and the inhibitor (66 ppm methoxy-hydroquinone) was removed from the methyl methacrylate by base extraction. The 9,10-dibromoanthracene was used as received from Aldrich Chemical Company, where all chemicals were acquired. Photochemical irradiations were carried out with filtered and non-filtered Eimac 150 watt high pressure Xenon arc lamp light sources. Polymer formation was determined gravimetrically via methanol precipitation of irradiated monomer-polymer solutions. Filters utilized were obtained from the Corning Glass Company.

The vehicle comprised MMA (10 g), DBA (0.02 g), and NSC (0.2 g). Aliquots of the sensitized photopolymerizable vehicle were subjected to unfiltered as well as a variety of filtered variations as set forth in Table 2 below. DBA does have absorption bands beyond 380 nm, but it was found necessary to include a sharp 410 nm cut-off filter so that direct absorption by the NSC ($\lambda_{max}$ 310 nm) would be prevented. Filter CS-3-74 permits about 35 percent of the light from the source into the 415 nm region which is sufficient to excite the $S_0$ to $S_1$ transition region of DBA. This filter also cuts off all light below 400 nm. Filter CS-1-59 transmits 380 to 700 nm but has approximately a 35 percent absorption in the IR radiation range. Filter CS-4-96 transmits 360 to 600 nm and strongly absorbs 660 to 1.5 microns. The results obtained appear below.

TABLE 2

| MMA | DBA | NSC | Filter CS-3-74 | Filter CS-1-59 | Filter CS-4-96 | Results |
|---|---|---|---|---|---|---|
| + | 1% | — | — | — | — | no polymer formed |
| + | — | 2% | — | — | — | polymer formed in 20 minutes |
| + | 1% | 2% | — | — | — | polymer formed in 1 hour |
| + | — | — | — | — | — | no polymer formed |
| + | 0.2% | — | yes | — | — | no polymer formed after 3 hours |
| + | — | 2% | yes | — | — | polymer formed after 3 hours |
| + | 0.2% | 2% | yes | — | — | polymer formed after 3 hours |
| + | 0.2% | 2% | yes | yes | — | 0.25 gms polymer formed in 1 hour |
| + | 0.2% | 2% | yes | yes | yes | 0.15 gms polymer formed in 1 hour |

Initially, it will be observed that irradiation of the full-band spectrum of the light onto the vehicle containing no donor or acceptor molecules did not result in any polymer formation. Unfiltered irradiation of the vehicle containing the DBA donor also resulted in no polymer formation since the donor molecule contains no functionality to generate free radicals. Of course, the mere presence of NSC acceptor molecules results in the formation of a polymer when unfiltered radiation is applied thereto. Utilizing filter CS-3-74, which cuts off energy below about 400 nm, polymerization only results when both the donor and acceptor are present. Application of filters CS-1-59 and CS-4-96 successively result in less polymer formation.

From these experiments it can be concluded that the donor-acceptor system above is a viable single-wavelength photoinitiator system and that the $T_1$ to $T_2$ DBA transition can be excited selectively to create efficient binary wavelength photoactive catalyst systems for the photopolymerization reaction.

EXAMPLE 2

The photopolymerizable vehicle comprised trimethylolpropane triacrylate (10 g), DBA (0.02 g), and NSC (0.2 g). The vehicle was placed in a pyrex test tube and subjected to the light source of Example 1 with all three filters. After 10 minutes radiation time, no polymerization was evident. Next, the vehicle was subjected to an infrared (IR) lamp for 30 minutes. Again, no reaction was evident. Finally, orthogonally intersecting beams of both light sources were projected into the vehicle. After 10 minutes, a generally cylindrically-shaped solid formed at the interior of the vehicle volume where the beams intersected. No polymerizate was evident at any other location.

We claim:

1. In a photopolymerizable vehicle of a medium selected from photopolymerizable vinyl monomers, vinyl oligomers, or mixtures thereof, and a photoinitiator system therefor, the improved photoinitiator system whereby said vehicle is selectively photopolymerized by application of a plurality of different selected wavelengths of energy wherein any single wavelength of energy is inadequate for effecting said photopolymerization and where said different selected wavelengths of energy are sequentially applied to said vehicle, which comprises:
  (a) a photosensitive donor lacking photoinitiating groups and responsive to first selective wavelengths of energy for generating primary excited-state donor molecules which are not responsive to said first selective wavelengths of energy, but are responsive to sequentially applied second selective wavelengths of energy for generating secondary higher energy level excited-state donor molecules, said donor selected from the group consisting of 9,10-dibromoanthracene, meso-tetraphenyl-porphyrin, a protoporphyrin dimethyl ester, and mixtures thereof;
  (b) a photoinitiating acceptor having a ground energy state below said primary donor energy state and a lowest primary excited-state at least about 5 kcal/mole greater than said primary excited state of said donor, said secondary higher energy level excited-state donor molecules being at least about 5 kcal/mole greater than said lowest primary excited-state of said acceptor and transferring energy to said acceptor for initiating photopolymerization of said vehicle, said acceptor selected from the group consisting of napthalene sulfonyl chloride, quinoline sulfonyl chloride, α-chloromethyl napthalene, brominated porphyrin, brominated rubrene, and mixtures thereof.

2. The vehicle of claim 1 wherein said wavelengths of energy are generated by lasers.

3. The vehicle of claim 1 wherein said vehicle contains a plurality of donors each of which is responsive to different selective wavelengths of energy.

4. The vehicle of claim 1 wherein said medium is selected from the group consisting of alkyl acrylates and methacrylates, hydroxy acrylates and methacrylates, glycol acrylates and methacrylates, allyl acrylates and methacrylates, epoxy acrylates and methacrylates, aminoplast acrylates and methacrylates, vinyl and vinylidene halides and amides, acrylamides, polybutadiene, styrene, and mixtures thereof.

5. The vehicle of claim 1 wherein said donor is 9,10-dibromoanthracene and said acceptor is napthalene sulfonyl chloride.

6. The vehicle of claim 1 wherein the molar ratio of acceptor molecules to donor molecules is at least about 3:1.

* * * * *